US008379684B1

(12) United States Patent
Bhat et al.

(10) Patent No.: US 8,379,684 B1
(45) Date of Patent: Feb. 19, 2013

(54) HOLE BLOCKING LAYERS IN NON-POLAR AND SEMI-POLAR GREEN LIGHT EMITTING DEVICES

(75) Inventors: Rajaram Bhat, Painted Post, NY (US); Dmitry S. Sizov, Corning, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/210,456

(22) Filed: Aug. 16, 2011

(51) Int. Cl.
*H01S 5/00* (2006.01)
*H01L 29/06* (2006.01)

(52) U.S. Cl. ............. 372/46.01; 372/43.01; 372/45.011; 257/13; 257/79

(58) Field of Classification Search .... 372/43.01–46.01; 257/13, 79
See application file for complete search history.

(56) References Cited

U.S. PATENT DOCUMENTS

| | | | | |
|---|---|---|---|---|
| 5,912,475 | A * | 6/1999 | Itagaki et al. | 257/94 |
| 2008/0111144 | A1 | 5/2008 | Fichtenbaum et al. | 257/96 |
| 2008/0188156 | A1 | 8/2008 | Buchhauser et al. | 445/22 |
| 2008/0308787 | A1 * | 12/2008 | Lee et al. | 257/13 |
| 2010/0008393 | A1 * | 1/2010 | Enya et al. | 372/46.01 |
| 2010/0150193 | A1 | 6/2010 | Bhat et al. | 372/44.01 |
| 2010/0270531 | A1 | 10/2010 | Samal | 257/13 |
| 2011/0176569 | A1 * | 7/2011 | Takagi et al. | 372/45.01 |
| 2011/0182311 | A1 * | 7/2011 | Yoshizumi et al. | 372/44.011 |
| 2012/0069863 | A1 * | 3/2012 | Sizov et al. | 372/45.012 |

OTHER PUBLICATIONS

T. Anthopoulos, et al., et al., "High efficient single-layer dendrimer light-emitting diodes with balanced charge transport", *Applied Physics Letters*, Jun. 30, 2003; American Institute of Physics, vol. 82, No. 26, pp. 4824-4826.

W. Bewley, et al., "Continuous-wave operation of $\lambda=3.25$ μm broadened-waveguide W quantum-well diode lasers up to T-195K", *Applied Physics Letters*, American Institute of Physics, Jan. 17, 2000, vol. 76, No. 3, pp. 256-258.

J. Heffernan, et al., "InGaN multiple quantum well lasers grown by MBE",*Phys. Stat. Sol. (A)*, 2005, vol. 202, No. 5, pp. 868-874.

J.W. Kang, et al., "Sinale- and triazinc-containing hole and exciton blocking material for high-efficiency phosphorescent organic light emitting diodes",*Journal of Materials Chemistry*, 2007, The Royal Society of Chemistry, pp. 3714-3719.

A. Knauer, et al., "Effect of the barrier composition on the polarization fields in near UV InGaN light emitting diodes", *Applied Physics Letters*, 2008, vol. 92, pp. 191-192. T. Li, et al., "Organic electroluminescent devices using europium complex-doped poly(N-vinylcarbazole)", *Polmers for Advanced Technologies*, John Wiley & Sons, Ltd., 2004, pp. 302-305.

J.S. Park, et al., "Effect of Carrier Blocking Layers on the Emission Characteristics of AlGaN-based Ultraviolet Light Emitting Diodes", *Japanese Journal of Applied Physics*, 2005, vol. 44, No. 10, pp. 7254-7259.

* cited by examiner

*Primary Examiner* — Jessica Stultz
*Assistant Examiner* — Phillip Nguyen
(74) *Attorney, Agent, or Firm* — Bruce P. Watson; Dinsmore & Shohl LLP

(57) ABSTRACT

Light emitting devices are provided comprising an active region interposed between n-type and p-type sides of the device and a hole blocking layer interposed between the active region and the n-type side of the device. The active region comprises an active MQW structure and is configured for electrically-pumped stimulated emission of photons in the green portion of the optical spectrum. The n-type side of the light emitting device comprises an n-doped semiconductor region. The p-type side of the light emitting device comprises a p-doped semiconductor region. The n-doped semiconductor region comprises an n-doped non-polar or n-doped semi-polar substrate. Hole blocking layers according to the present disclosure comprise an n-doped semiconductor material and are interposed between the non-polar or semi-polar substrate and the active region of the light emitting device. The hole blocking layer (HBL) composition is characterized by a wider bandgap than that of the quantum well barrier layers of the active region.

20 Claims, 1 Drawing Sheet

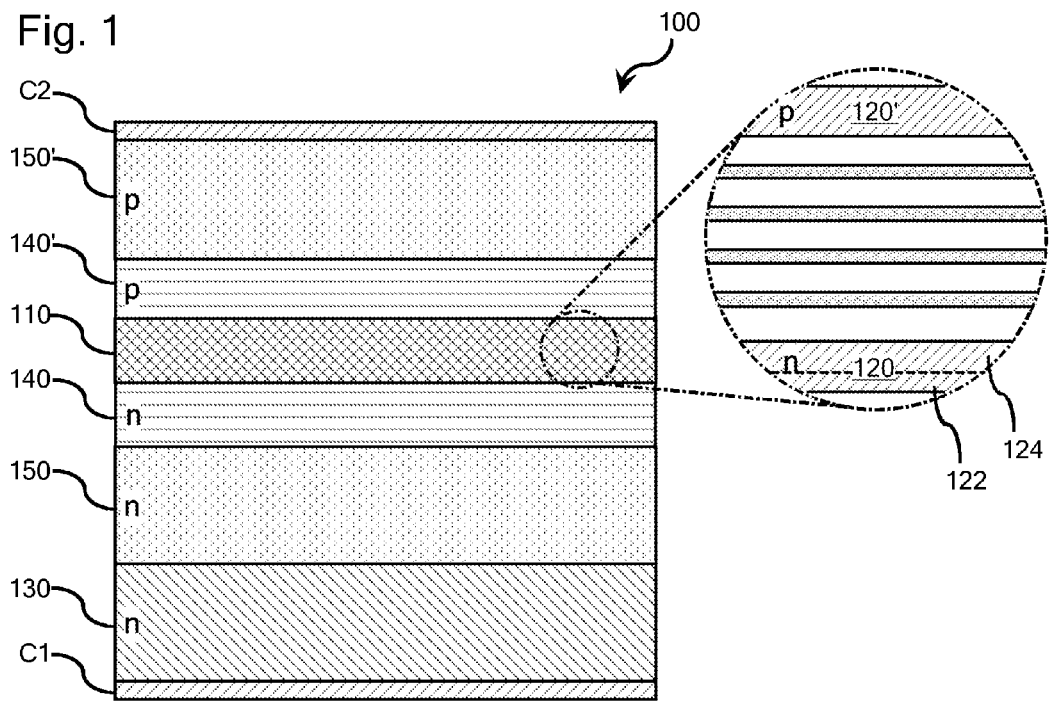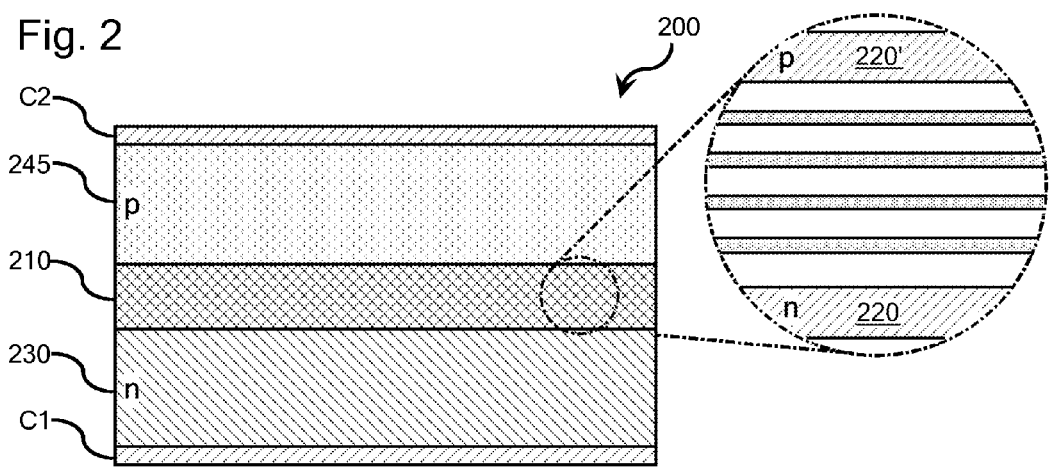

HOLE BLOCKING LAYERS IN NON-POLAR AND SEMI-POLAR GREEN LIGHT EMITTING DEVICES

BACKGROUND

The present disclosure relates to light emitting devices and, more particularly, to laser diodes and LEDs that are designed for high wall plug efficiency and can operate as native green light sources.

BRIEF SUMMARY

The present inventors have recognized the advantage of using non-polar and semipolar substrates in the design and fabrication of native green laser diodes and LEDs based on group III nitride (III-N) semiconductor compounds. In the context of the present disclosure, it is noted that emission wavelengths in the green portion of the spectrum include aquamarine and lie between approximately 480 nm and approximately 570 nm. According to the present disclosure, light emitting devices are provided comprising an active region interposed between n-type and p-type sides of the device and a hole blocking layer interposed between the active region and the n-type side of the device. The active region comprises an active MQW structure and is configured for electrically-pumped stimulated emission of photons in the green portion of the optical spectrum. The n-type side of the light emitting device comprises an n-doped semiconductor region. The p-type side of the light emitting device comprises a p-doped semiconductor region. The n-doped semiconductor region comprises an n-doped non-polar or n-doped semi-polar substrate. When semipolar or nonpolar substrates are used for creating such light emitters for such wavelengths, hole transport across the active region followed by hole penetration to n-doped region can be significant. Since holes are subject of strong parasitic recombination in n-doped region, it is desirable to block hole penetration. Hole blocking layers according to the present disclosure comprise an n-doped semiconductor material and are interposed between the non-polar or semi-polar substrate and the active region of the light emitting device. The hole blocking layer (HBL) composition is characterized by a wider bandgap than that of the quantum well barrier layers of the active region.

The present inventors have also recognized that native green light sources exhibiting relatively high wall plug efficiency can be more readily manufactured if restrictions on misfit defect formation in one or more of the n-doped layers of the laser diode or LED device can be relaxed. This recognition is particularly significant in the context of laser diode and LED devices grown on non-polar and semipolar substrates because, during the growth of AlGaN, InGaN, and similar device layers, strong tensile and compressive strain accumulate and it can become difficult to limit the formation of misfit dislocations upon strain relaxation. In some embodiments, laser diode and LED configurations are contemplated where the n-doped layers of the laser diode or LED device are characterized by relatively high defect density and an n-doped hole blocking layer (HBL) is utilized to suppress hole penetration to the high defect density zone, and the associated non-radiative recombination, while neutralizing or offsetting the high defect density of the other n-doped layers of the device.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which:

FIG. 1 is a schematic illustration of simplified laser diode structure incorporating concepts of the present disclosure; and FIG. 2 is a schematic illustration of simplified LED structure incorporating concepts of the present disclosure.

DETAILED DESCRIPTION

The concepts of the present disclosure can be illustrated in the context of two different types of semiconductor-based light emitting devices—a laser diode 100 (FIG. 1) and a light emitting diode 200 (FIG. 2). The laser diode 100 illustrated in FIG. 1 comprises an active region 110 interposed between n-type and p-type sides of the device and a hole blocking layer (HBL) 120 interposed between the active region 110 and the n-type side of the device. The n-type and p-type sides of the laser diode 100 generally comprise n-doped and p-doped semiconductor regions, described in further detail below, and device contact layers C1, C2.

The active region 110 of the laser diode 100 comprises an active MQW structure and is configured for electrically-pumped stimulated emission of photons in the green portion of the optical spectrum. The n-type side of the laser diode 100 comprises an n-doped semiconductor region composed of an n-doped non-polar or n-doped semi-polar substrate 130, an n-doped waveguide layer 140 interposed between the non-polar or semi-polar substrate 130 and the n-doped hole blocking layer 120. The non-polar or semi-polar substrate 130 may comprise any of a variety of non-polar or semi-polar configurations 130 and may be presented as a single layer substrate comprising, for example, a group III nitride (III-N) semiconductor compound, or as a multi-layer substrate comprising a base layer and a superstrate of the desired non-polar or semi-polar orientation. In practicing the concepts of the present disclosure, it should be appreciated that the terms "non-polar" and "semi-polar" refer to the plane orientation in the wurtzite crystal structure of III/N semiconductors. More particularly, "non-polar" orientations are parallel to the c-axis of the crystal structure. For example, and not by way of limitation, contemplated "non-polar" orientations include (1-100) or (11-20). "Semi-polar" orientations are orientations where the plane is tilted between polar and nonpolar planes. For example, and not by way of limitation, contemplated "semi-polar" orientations include (11-22), (20-21), and (20-2-1). Examples of orientations that are considered "polar" include, but are not limited to (0001) and (000-1).

The n-doped semiconductor region of the laser diode 100 further comprises an n-doped cladding layer 150 interposed between the n-doped waveguide layer 140 and the non-polar or semi-polar substrate 130. The p-doped semiconductor region of the laser diode 100 comprises a p-doped waveguide layer 140' interposed between a p-doped cladding layer 150' and the active region 110. The p-doped semiconductor region of the laser diode 100 may further comprise an electron blocking layer 120' interposed between the p-doped waveguide layer 140' and the active region 110. For example, and not by way of limitation, the electron blocking layer can be configured according to the teachings of US 2010/0150193 A1.

The active region 110, waveguide layers 140, 140', and cladding layers 150, 150' are formed as a multi-layered laser diode over the non-polar or semi-polar crystal growth plane of the non-polar or semi-polar substrate 130. The waveguide layers 140, 140' guide the stimulated emission of photons from the active region 110 and the cladding layers 150, 150' promote propagation of the emitted photons in the waveguide layers 140, 140'.

The HBL 120 comprises an n-doped semiconductor material and is interposed between the non-polar or semi-polar substrate 130 and the active region 110. For example, and not by way of limitation, it is contemplated that the HBL may comprise AlGaN having an AlN mole fraction between approximately 10% and approximately 30%. By doping the HBL 120, electron transport across the HBL will be enhanced thus improving electron injection in the active region 110 while blocking hole leakage from the active region 110 beyond the HBL 120 into the n-doped region. The n-doped region is necessary for injecting electrons into the MQW active region. However, if holes injected from the p-doped regions pass the active region and penetrate into the n-doped region, strong parasitic recombination in the n-doped region occurs, reducing quantum efficiency of LEDs or laser diodes as a result of reduced injection efficiency. The present inventors have recognized that hole transport across the MQW in aquamarine and green light emitters can be prominent when nonpolar or semipolar substrate orientations are used and that, if the portion of holes passing the MQW active region is large, hole penetration in the n-doped region can be significant, which makes hole blocking by means of HBL desirable. The inventors have also recognized that defect and impurity density in the region between MQW and HBL should be relatively low. For example, and not by way of limitation, the HBL 120 may comprise $Al_{0.2}Ga_{0.8}N$ and/or AlInGaN. Where the active MQW structure of the active region 110 comprises In, it will tend to introduce compressive strain in the light emitting device 100 and the HBL 120 can be selected to comprise a sufficient amount of Al to at least partially compensate for the strain introduced by the MQW structure.

Strong parasitic nonradiative recombination also occurs in case if holes penetrate to an area with high defect density. The present inventors have recognized that laser diode structures on non-polar and semi-polar growth planes are often highly susceptible to crystal lattice misfit defect formation. The present inventors have also recognized significant advantages to permitting a relatively high level of misfit defect formation on the n-side of the device. More specifically, according to the concepts of the present disclosure, light emitting device configurations are contemplated where the n-doped layers of the device may have relatively high defect density for in-plane misfit dislocations and an n-doped hole blocking layer (HBL) is utilized to neutralize or offset the high defect density of the other n-doped layers of the device. The resulting device design can be characterized by relatively high operating efficiency and is relatively easy to manufacture, particularly when compared to other high efficiency semiconductor-based light emitting devices where significant efforts are made to reduce defect density on the n-side of the device. Accordingly, laser diodes according to some embodiments of present disclosure are preferably designed such that the defect density of the n-doped waveguide layer 140 for in-plane misfit dislocations will be greater than the defect density of the HBL 120, the active MQW structure 110, and any regions between the HBL 120 and the active MQW structure 110—an approach that would otherwise seem counter-intuitive in view of the continuing drive in the art to minimize defect density for in-plane misfit dislocations.

Particular embodiments are contemplated where the defect density of the n-doped waveguide layer 140 for in-plane misfit dislocations is at least twice the magnitude of the defect density of the HBL 120 for in-plane misfit dislocations. Other embodiments are contemplated where the defect density of the n-doped waveguide layer 140 for in-plane misfit dislocations is at least one order of magnitude greater than the defect density of the HBL 120, the active MQW structure 110, and any regions between the HBL 120 and the active MQW structure 110 for in-plane misfit dislocations. Generally, the defect density of the n-doped semiconductor region will be between approximately $1\times10^2$ $cm^{-2}$ and approximately $10^6$ $cm^{-2}$ for threading dislocations and below approximately $2\times10^6$ $cm^{-1}$ for in-plane misfit dislocations. More specifically, it is contemplated that the defect density of the n-doped waveguide layer 140, or any transition layer between the n-doped waveguide layer 140 and the HBL 120, can be selected to be between approximately $1\times10^2$ $cm^{-2}$ and approximately $1\times10^6$ $cm^{-2}$ for threading dislocations and between approximately $1\times10^4$ $cm^{-1}$ and approximately $2\times10^6$ $cm^{-1}$ for in-plane misfit dislocations. It is contemplated that the defect density of the HBL 120, the active MQW structure 110, and any regions between the HBL 120 and the active MQW structure 110 can be selected to be below approximately $1\times10^6$ $cm^{-2}$ for threading dislocations and below approximately $1\times10^3$ $cm^{-1}$ for in-plane misfit dislocations.

The n-doped HBL 120, which may define a thickness of between approximately 3 nm and approximately 100 nm, may be characterized by a dopant density less than approximately $1\times10^{20}$ $cm^{-3}$, or more specifically, between approximately $3\times10^{17}$ $cm^{-3}$ and approximately $1\times10^{19}$ $cm^{-3}$. The n-doped semiconductor region comprising the components described above may be characterized by an average dopant density less than approximately $1\times10^{19}$ $cm^{-3}$, or more specifically, between approximately $3\times10^{17}$ $cm^{-3}$ and approximately $3\times10^{18}$ $cm^{-3}$.

Embodiments of the present disclosure are contemplated where the HBL 120 comprises a transitional hole blocking region 122 and a native hole blocking region 124. As is illustrated in FIG. 1, the transitional hole blocking region 122 of the HBL 120 is positioned adjacent to the n-doped semiconductor region of the laser diode 100 and comprises a compositional component that is selected to match a corresponding compositional component of the n-doped semiconductor region. For example, where the n-doped waveguide layer 140 is presented as InGaN and the native hole blocking region 124 is presented as AlGaN, the transitional hole blocking region 122 can be presented as AlInGaN to help ensure proper growth of the HBL 120 over the n-doped waveguide layer 140 and improve the operational integrity of the laser diode 100.

It is contemplated that the active region 110 and the n-type and p-type sides of the laser diode 100 may be fabricated utilizing materials system constructed from GaN, InGaN, AlInGaN, or combinations thereof. Similarly, the HBL 120 may comprise GaN, InGaN, AlInGaN, or combinations thereof. It is also contemplated that the active MQW structure of the active region 110 may comprise a plurality of nanometer scale quantum wells in alternating succession with a plurality of quantum well barrier layers, both of which are illustrated schematically in FIGS. 1 and 2.

Finally, as is illustrated in FIG. 2, it is contemplated that light emitting devices according to the present disclosure can be configured in the form of a light emitting diode (LED) 200 comprising an active region 210, a hole blocking layer (HBL) 220, electron blocking layer 220', and a p-doped semiconductor region 245. In one embodiment, the defect density of the non-polar or semi-polar substrate 230 for in-plane misfit dislocations will be selected to be greater than the defect density of the HBL 220 for in-plane misfit dislocations.

A variety of alternative laser diode and LED configurations incorporating the concepts of the present disclosure are contemplated. For example, the present disclosure contemplates the use of a variety of alternative configurations for the active region, the cladding regions, and the contact layers described herein. It is also contemplated that the cladding layers of the laser diode structure illustrated in FIG. 1 may comprise GaN, AlGaN, AlInGaN, or some combination thereof and that the material composition of the two cladding layers may be different and vary across the cladding layer. Similarly, the multi-quantum well (MQW) active region may take a variety of forms familiar to those skilled in the art.

In addition, it is noted that laser diode and LED configurations according to the present disclosure will typically incorporate additional layers not illustrated in FIGS. 1 and 2, including for example, buffer layers, one or more additional optical confinement layers, etc. For laser diode structures, the respective active, waveguiding, and upper and lower cladding regions can be formed as a multi-layered laser diode over the non-polar or semi-polar crystal growth plane of the underlying substrate. The upper and lower waveguiding layers guide the stimulated emission of photons from the active region and the cladding regions promote propagation of the emitted photons in the waveguiding layers. It is contemplated that the waveguiding layers may be configured as passive MQW waveguide layers including nanometer scale quantum wells and barrier layers. It is further contemplated that laser diode structures according to the present disclosure may comprise a waveguide core composed of the active region and waveguide layers in an asymmetric configuration, shifting the optical mode to the n-side of the device. A benefit of this asymmetrical configuration is that there would be less mode penetration to the p-type material which in turn would reduce optical loss. The waveguiding and cladding layers may also comprise superstructure made of InGaN, GaN, AlGaN, AlInN, AlInGaN or combination thereof.

The electron and hole blocking layers would preferably comprise GaN, AlGaN or AlInGaN with a bandgap wider than the bandgap of the barriers between the quantum wells in active region. If the electron and hole blocking layers comprise Al, they would also contribute to strain compensation.

In the context of the present disclosure, the reference herein to "non-polar" or "semi-polar" substrates refers to the crystal plane orientation of the substrate and is distinguished from polar substrates, e.g., LEDs and laser diodes grown on c-plane substrates. Nonpolar substrates may have m-plane or a-plane orientations. Semipolar substrates are characterized by surface planes that are tilted between the nonpolar and semipolar planes.

It is noted that recitations herein of a component of the present disclosure being "configured" to embody a particular property, or function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention, it is noted that the term "approximately" is utilized herein to represent the inherent degree of uncertainty that may be attributed to any quantitative comparison, value, measurement, or other representation. The term "approximately" is also utilized herein to represent the degree by which a quantitative representation may vary from a stated reference without resulting in a change in the basic function of the subject matter at issue.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A light emitting device comprising an active region interposed between n-type and p-type sides of the device and a hole blocking layer interposed between the active region and the n-type side of the device, wherein:
   the light emitting device is a laser diode;
   the n-type and p-type sides of the device comprise group III nitride (III-N) semiconductor compounds;
   the active region comprises an active MQW structure and is configured for electrically-pumped stimulated emission of photons in the green portion of the optical spectrum;
   the n-type side of the light emitting device comprises an n-doped semiconductor region;
   the p-type side of the light emitting device comprises a p-doped semiconductor region;
   the n-doped semiconductor region comprises an n-doped non-polar or n-doped semi-polar substrate;
   the hole blocking layer (HBL) comprises an n-doped semiconductor material and is interposed between the non-polar or semi-polar substrate and the active region;
   the n-doped semiconductor region of the laser diode comprises an n-doped waveguide layer interposed between the non-polar or semi-polar substrate and the n-doped hole blocking layer;
   the n-doped semiconductor region of the laser diode further comprises an n-doped cladding layer interposed between the n-doped waveguide layer and the non-polar or semi-polar substrate;
   the active region, waveguide layer, and cladding layer are formed as a multi-layered laser diode over the non-polar or semi-polar crystal growth plane of the non-polar or semi-polar substrate such that the waveguide layer guides the stimulated emission of photons from the active region, and the cladding layer promotes propagation of the emitted photons in the waveguide layer;
   the active MQW structure of the active region comprises a plurality of nanometer scale quantum wells in alternating succession with a plurality of quantum well barrier layers; and
   the HBL composition is characterized by a wider bandgap than that of the quantum well barrier layers.

2. A light emitting device as claimed in claim 1 wherein:
the n-doped HBL is characterized by a dopant density between approximately $3 \times 10^{17}$ cm$^{-3}$ and approximately $1 \times 10^{19}$ cm$^{-3}$; and
the n-doped semiconductor region is characterized by an average dopant density between approximately $3 \times 10^{17}$ cm$^{-3}$ and approximately $3 \times 10^{18}$ cm$^{-3}$.

3. A light emitting device as claimed in claim 1 wherein:
the n-doped HBL is characterized by a dopant density less than approximately $1 \times 10^{20}$ cm$^{-3}$; and
the n-doped semiconductor region is characterized by an average dopant density less than approximately $1 \times 10^{19}$ cm$^{-3}$.

4. A light emitting device as claimed in claim 1 wherein a defect density of the n-doped semiconductor region is between approximately $1 \times 10^{2}$ cm$^{-2}$ and approximately $1 \times 10^{6}$ cm$^{-2}$ for threading dislocations and below approximately $2 \times 10^{6}$ cm$^{-1}$ for in-plane misfit dislocations.

5. A light emitting device as claimed in claim 1 wherein a defect density of the n-doped waveguide layer for in-plane misfit dislocations is at least twice the magnitude of a defect density of the HBL, the active MQW structure, and any regions between the HBL and the active MQW structure for in-plane misfit dislocations.

6. A light emitting device as claimed in claim 1 wherein a defect density of the n-doped waveguide layer for in-plane misfit dislocations is at least one order of magnitude greater than a defect density of the HBL, the active MQW structure, and any regions between the HBL and the active MQW structure for in-plane misfit dislocations.

7. A light emitting device as claimed in claim 1 wherein:
the p-doped semiconductor region of the laser diode comprises a p-doped waveguide layer interposed between a p-doped cladding layer and the active region; and
the laser diode further comprises an electron blocking layer interposed between the p-doped waveguide layer and the active region.

8. A light emitting device as claimed in claim 1 wherein the substrate is a non-polar substrate.

9. A light emitting device as claimed in claim 1 wherein the substrate is a semi-polar substrate.

10. A light emitting device as claimed in claim 1 wherein the substrate is a semi-polar substrate characterized by (11-22), (20-21), or (20-2-1) semi-polar plane orientation.

11. A light emitting device as claimed in claim 1 wherein the HBL comprises AlGaN having an AlN mole fraction between approximately 10% and approximately 30%.

12. A light emitting device as claimed in claim 1 wherein:
the active MQW structure comprises In and is disposed to introduce compressive strain in the light emitting device; and
the HBL comprises a sufficient amount of Al to at least partially compensate for the strain introduced by the MQW structure.

13. A light emitting device comprising an active region interposed between n-type and p-type sides of the device and a hole blocking layer interposed between the active region and the n-type side of the device, wherein:
the n-type and p-type sides of the device comprise group III nitride (III-N) semiconductor compounds;
the active region comprises an active MQW structure and is configured for electrically-pumped stimulated emission of photons in the green portion of the optical spectrum;
the n-type side of the light emitting device comprises an n-doped semiconductor region;
the p-type side of the light emitting device comprises a p-doped semiconductor region;
the n-doped semiconductor region comprises an n-doped non-polar or n-doped semi-polar substrate;
the hole blocking layer (HBL) comprises an n-doped semiconductor material and is interposed between the non-polar or semi-polar substrate and the active region;
the active MQW structure of the active region comprises a plurality of nanometer scale quantum wells in alternating succession with a plurality of quantum well barrier layers;
the HBL composition is characterized by a wider bandgap than that of the quantum well barrier layers;
a defect density of the HBL, the active MQW structure, and any regions between the HBL and the active MQW structure, is below approximately $1 \times 10^{6}$ cm$^{-2}$ for threading dislocations and below approximately $1 \times 10^{3}$ cm$^{-1}$ for in-plane misfit dislocations; and
a defect density of the n-doped semiconductor region for in-plane misfit dislocations is greater than the defect density of the HBL, the active MQW structure, and any regions between the HBL and the active MQW structure for in-plane misfit dislocations.

14. A light emitting device as claimed in claim 13 wherein the defect density of the n-doped semiconductor region for in-plane misfit dislocations is at least twice the magnitude of the defect density of the HBL, the active MQW structure, and any regions between the HBL and the active MQW structure for in-plane misfit dislocations.

15. A light emitting device as claimed in claim 13 wherein the defect density of the n-doped semiconductor region for in-plane misfit dislocations is at least one order of magnitude greater than the defect density of the HBL, the active MQW structure, and any regions between the HBL and the active MQW structure for in-plane misfit dislocations.

16. A light emitting device as claimed in claim 13 wherein the light emitting device is a light emitting diode (LED).

17. A light emitting device comprising an active region interposed between n-type and p-type sides of the device and a hole blocking layer interposed between the active region and the n-type side of the device, wherein:
the n-type and p-type sides of the device comprise group III nitride (III-N) semiconductor compounds;
the active region comprises an active MQW structure and is configured for electrically-pumped stimulated emission of photons in the green portion of the optical spectrum;
the n-type side of the light emitting device comprises an n-doped semiconductor region;
the p-type side of the light emitting device comprises a p-doped semiconductor region;
the n-doped semiconductor region comprises an n-doped non-polar or n-doped semi-polar substrate;
the hole blocking layer (HBL) comprises an n-doped semiconductor material and is interposed between the non-polar or semi-polar substrate and the active region;
the active MQW structure of the active region comprises a plurality of nanometer scale quantum wells in alternating succession with a plurality of quantum well barrier layers;
the HBL composition is characterized by a wider bandgap than that of the quantum well barrier layers;
the light emitting device is a laser diode;
the n-doped semiconductor region of the light emitting device comprises an n-doped waveguide layer interposed between an n-doped substrate and the n-doped hole blocking layer; and
a defect density of the n-doped waveguide layer or any transition layer between the n-doped waveguide layer and the HBL is between approximately $1 \times 10^{2}$ cm$^{-2}$ and approximately $1\times10^6$ cm$^{-2}$ for threading dislocations and between approximately $1\times10^4$ cm$^{-1}$ and approximately $2\times10^6$ cm$^{-1}$ for in-plane misfit dislocations.

18. A light emitting device comprising an active region interposed between n-type and p-type sides of the device and a hole blocking layer interposed between the active region and the n-type side of the device, wherein:

the n-type and p-type sides of the device comprise group III nitride (III-N) semiconductor compounds;

the active region comprises an active MQW structure and is configured for electrically-pumped stimulated emission of photons in the green portion of the optical spectrum;

the n-type side of the light emitting device comprises an n-doped semiconductor region;

the p-type side of the light emitting device comprises a p-doped semiconductor region;

the n-doped semiconductor region comprises an n-doped non-polar or n-doped semi-polar substrate;

the hole blocking layer (HBL) comprises an n-doped semiconductor material and is interposed between the non-polar or semi-polar substrate and the active region;

the active MQW structure of the active region comprises a plurality of nanometer scale quantum wells in alternating succession with a plurality of quantum well barrier layers;

the HBL composition is characterized by a wider bandgap than that of the quantum well barrier layers;

the HBL comprises a transitional hole blocking region and a native hole blocking region;

the transitional hole blocking region of the HBL is positioned closer to the n-doped semiconductor region than the native hole blocking region;

the transitional hole blocking region comprises a compositional component selected to match a compositional component of the n-doped semiconductor region; and the compositional component is present in the transitional hole blocking region to a significantly greater extent than in the native hole blocking region.

19. A light emitting device as claimed in claim 18 wherein:

the n-doped waveguide layer comprises InGaN;

the native hole blocking region comprises AlGaN; and the transitional hole blocking region comprises AlInGaN to help ensure proper growth of the HBL and improve the operational integrity of the light emitting device.

20. A light emitting device comprising an active region interposed between n-type and p-type sides of the device and a hole blocking layer interposed between the active region and the n-type side of the device, wherein:

the active region comprises an active MQW structure and is configured for electrically-pumped stimulated emission of photons in the green portion of the optical spectrum;

the n-type side of the light emitting device comprises an n-doped semiconductor region;

the p-type side of the light emitting device comprises a p-doped semiconductor region;

the n-doped semiconductor region comprises an n-doped non-polar or n-doped semi-polar substrate;

the hole blocking layer (HBL) comprises an n-doped semiconductor material and is interposed between the non-polar or semi-polar substrate and the active region;

a defect density of the HBL is below approximately $1\times10^6$ cm$^{-2}$ for threading dislocations and below approximately $1\times10^3$ cm$^{-1}$ for in-plane misfit dislocations a defect density of the n-doped semiconductor region is between approximately $1\times10^2$ cm$^{-2}$ and approximately $1\times10^6$ cm$^{-2}$ for threading dislocations and below approximately $2\times10^6$ cm$^{-1}$ for in-plane misfit dislocations;

the n-doped HBL is characterized by a dopant density between approximately $3\times10^{17}$ cm$^{-3}$ and approximately $1\times10^{19}$ cm$^{-3}$;

the n-doped semiconductor region is characterized by an average dopant density between approximately $3\times10^{17}$ cm$^{-3}$ and approximately $3\times10^{18}$ cm$^{-3}$.

* * * * *